(12) United States Patent
Marr

(10) Patent No.: US 7,369,379 B2
(45) Date of Patent: *May 6, 2008

(54) METHODS, CIRCUITS, AND APPLICATIONS USING A RESISTOR AND A SCHOTTKY DIODE

(75) Inventor: Kenneth W. Marr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/416,819

(22) Filed: May 3, 2006

(65) Prior Publication Data

US 2006/0198070 A1 Sep. 7, 2006

Related U.S. Application Data

(63) Continuation of application No. 10/284,808, filed on Oct. 31, 2002, now Pat. No. 7,075,763.

(51) Int. Cl.
*H02H 3/22* (2006.01)

(52) U.S. Cl. .................... 361/56; 361/111

(58) Field of Classification Search ........... 361/56–58, 361/91.1, 111
See application file for complete search history.

(56) References Cited

U.S. PATENT DOCUMENTS

| | | | |
|---|---|---|---|
| 4,513,309 A | 4/1985 | Cricchi | |
| 4,675,551 A | 6/1987 | Stevenson | |
| 4,763,184 A * | 8/1988 | Krieger et al. | 257/362 |
| 4,875,130 A | 10/1989 | Huard | |
| 4,930,036 A * | 5/1990 | Sitch | 361/56 |
| 5,166,089 A | 11/1992 | Chen | |
| 5,181,091 A | 1/1993 | Harrington, III | |
| 5,208,719 A | 5/1993 | Wei | |
| 5,276,582 A | 1/1994 | Merrill et al. | |
| 5,412,527 A | 5/1995 | Husher | |
| 5,510,947 A | 4/1996 | Pellegrini | |
| 5,525,829 A | 6/1996 | Mistry | |
| 5,528,188 A | 6/1996 | Au et al. | |
| 5,753,955 A | 5/1998 | Fechner | |
| 5,763,918 A | 6/1998 | El-Kareh | |
| 5,770,886 A | 6/1998 | Rao et al. | |
| 5,818,084 A | 10/1998 | Williams et al. | |
| 6,111,734 A | 8/2000 | Harrington | |
| 6,172,383 B1 | 1/2001 | Williams | |
| 6,329,692 B1 | 12/2001 | Smith | |
| 6,924,963 B2 * | 8/2005 | Young et al. | 361/111 |
| 7,075,763 B2 * | 7/2006 | Marr | 361/56 |
| 2001/0016380 A1 * | 8/2001 | Watanabe et al. | 438/237 |
| 2003/0168701 A1 | 9/2003 | Voldman | |

* cited by examiner

*Primary Examiner*—Michael Sherry
*Assistant Examiner*—Danny Nguyen
(74) *Attorney, Agent, or Firm*—Leffert Jay & Polglaze, P.A.

(57) ABSTRACT

A combination of a current limiting resistor and a clamping Schottky diode prevent substantial forward biasing of a pn junction associated with a pad in a snapback device during normal operation, but do not substantially affect triggering of the device during an unbiased electrostatic discharge event. Minority carrier injection from n+ devices is substantially reduced, and the circuit may also be used to clamp an oxide voltage in a thin oxide semiconductor device.

13 Claims, 6 Drawing Sheets

METHODS, CIRCUITS, AND APPLICATIONS USING A RESISTOR AND A SCHOTTKY DIODE

RELATED APPLICATIONS

This application is a Continuation of U.S. patent application Ser. No. 10/284,808, filed Oct. 31, 2002 now U.S. Pat. No. 7,075,763 and titled, "Methods, Circuits, and Applications Using a Resistor and a Schottky Diode," which is commonly assigned and incorporated by reference herein in its entirety.

FIELD

The present invention relates generally to semiconductor devices, and more specifically to semiconductor memory devices.

BACKGROUND

Electrostatic discharge (ESD) is a static buildup of electrons that is then discharged. ESD is a problem in integrated circuits. An ESD event can arise from a number of sources such as improper handling of a device or printed circuit board or the like. The magnitude of ESD can vary widely, but the duration of a pulse is usually very short. An ESD event can result injunction failure, contact damage, filamentation, oxide thermal damage, oxide breakdown, charge injection and fusing (opening) of interconnects.

Because ESD is such a prevalent problem, on chip ESD protection circuits typically used on integrated circuits for I/O and power supply cells are the main measures to cope with ESD problems. The role of these protection circuits is to ensure that, in case of an ESD event, a discharge pulse is safely diverted to ground and does not destroy or damage the logic circuitry.

Typical ESD protection devices have a snapback voltage ($V_{ab}$) at which the device enters an operating region known as snapback. Snapback is a state of a device in which the current/voltage curve of the device, when the snapback voltage is reached, will abruptly change, or snap back, to allow the same amount of current to flow at a significantly lower voltage. Source triggering the supply ESD device into snapback and interrupting normal operation of the IC can cause damage to or destruction of the device and/or IC. It is intended that snapback does not occur during normal part operation, but does occur during an unbiased ESD event.

As gate oxide thicknesses in semiconductor devices, such as metal oxide semiconductor (MOS) devices, decrease, it becomes important to keep the snapback voltage of electrostatic discharge protection devices low enough that they can protect the input buffer. However, if the snapback trigger voltage is close to the operating voltage ($V_{cc}$) for example during burnin, then the ESD devices can be accidentally triggered by minor undershoot (on the order of −0.5 volts) and cause electrical noise or even more severe problems. It is less likely but still possible to cause customer issues (such as excessive $V_{cc}$ noise).

ESD protection circuitry is typically used on integrated circuits to help in protecting sensitive electronic components from an ESD event. Typical on-chip ESD protection circuits include one or more of the following: snapback devices, diodes, diode strings, silicon controlled rectifiers (SCRs), and the like. A snapback device as used herein includes by way of example and not by way of limitation metal oxide semiconductor (MOS) devices, shallow trench isolation (STI) field isolation devices in which two adjacent n+ diffusion regions are separated by an STI oxide, local oxidation of silicon (LOCOS) field oxide devices, and the like.

Electro-Static-Discharge (ESD) phenomena are becoming a major reliability- and cost-constraint for integrated circuit (IC) components. Besides the usual anti static precautions in the production sites of electronic components, better on chip ESD protection circuits for I/O and power supply cells are the main measures to cope with ESD problems. The role of these protection circuits is to ensure that, in case of an ESD event, the discharge pulse is safely diverted to ground and does not destroy or damage the logic circuitry.

Snapback occurs because of parasitic bipolar transistor devices that are present in nearly all snapback devices. There is a need in the art to control unintended triggering of the ESD snapback protection device during operation of the IC.

DETAILED DESCRIPTION

In the following detailed description of the embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention.

Figure 1:
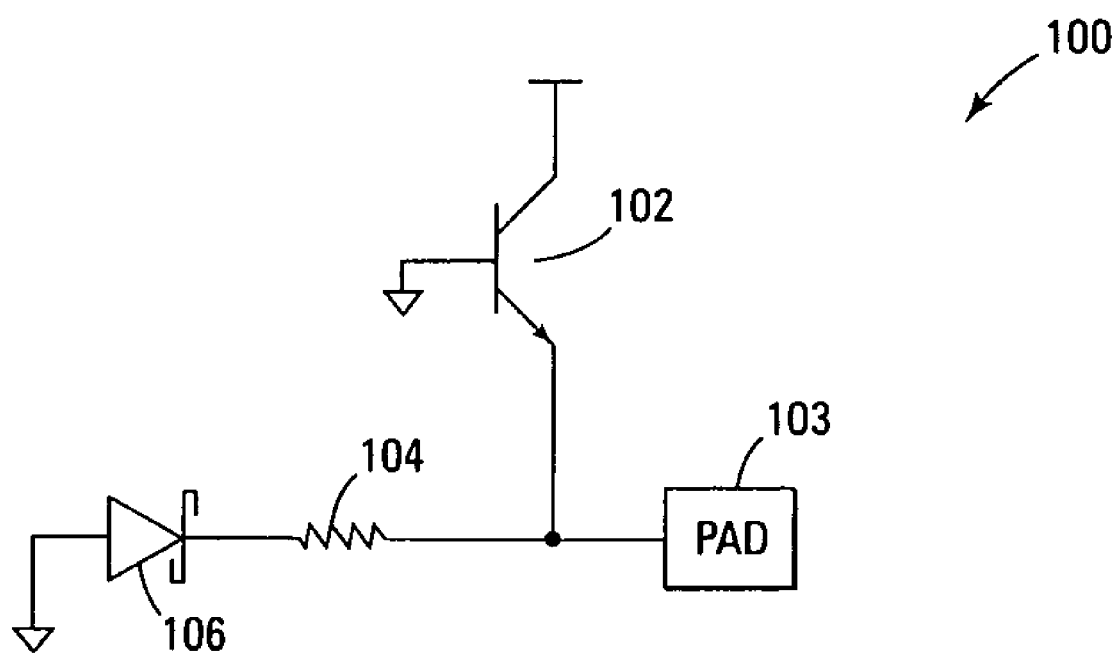
FIG. 1 is a circuit diagram of one embodiment of the present invention.

In one embodiment 100 shown in FIG. 1, a parasitic snapback transistor 102 for a snapback device is formed between a supply voltage and a pad 103. The parasitic bipolar transistor is typically a parasitic device between the drain and source of a snapback device. Connected between the pad and $V_{ss}$ (ground) is a series connection of a resistor 104 and a Schottky diode 106. The resistor 104 and Schottky diode 106 have their resistance R and area A, respectively, configured to substantially prevent forward bias of the parasitic pn junction diode in parasitic bipolar 102 during operation of the part to which the parasitic device belongs but to substantially not affect ESD operation. Schottky diode area and resistance value are configured to substantially prevent source triggered snapback of ESD devices associated with input or output or I/O pads.

The placement of the resistor 104 and the diode 106 are made in one embodiment with the resistor 104 closest to the pad 103 and the diode 106 closest to ground. This configuration helps to protects the diode 106 from an ESD event. During such an event, the resistor 104 limits current that in a configuration without a resistor would potentially overload the Schottky diode, causing a Schottky diode failure.

The Schottky diode 106 acts as a clamp diode to $V_{ss}$ in order to prevent accidental source triggered snapback of the supply voltage ESD snapback device during operation. This is most typically an event that occurs during burnin or testing when voltages on the part approach a snapback voltage $V_{sb}$. The series combination of the resistor 104 and the Schottky diode 106 is to $V_{SS}$.

The series combination of resistor 104 and Schottky diode 106 is in one embodiment formed on an integrated circuit having terminals at the resistor and the Schottky diode. This on-chip circuit uses the resistor to limit current to the Schottky during an ESD event, and the Schottky diode to clamp the pad voltage during undershoot.

Figure 2:
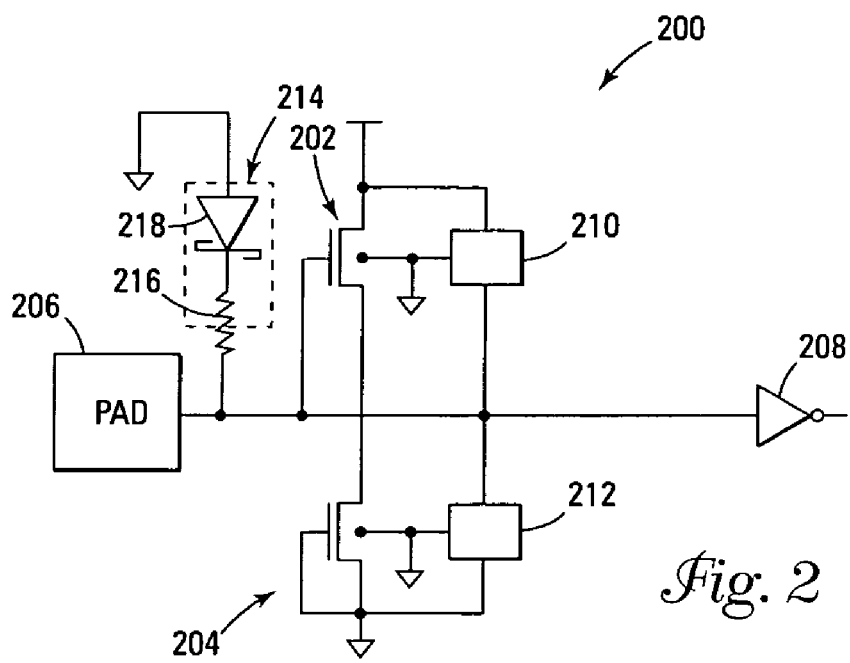
FIG. 2 is a circuit diagram of another embodiment of the present invention.

In one embodiment shown in FIG. 2, the snapback device to which the parasitic bipolar belongs is an electrostatic discharge (ESD) device. FIG. 2 shows an ESD configuration circuit 200 comprising a pair of ESD devices 202 and 204 connectable to a pad 206 and an input buffer 208. The ESD devices are snapback devices which have associated parasitic bipolar devices 210 and 212 as described above. A protection circuit 214 for ESD device 210 comprises a resistor 216 and a Schottky diode 218 connected in series between the pad 206 and ground. The series connection 214 is in parallel with the base to emitter pn junction diode of the parasitic bipolar transistor 210.

Figure 3:
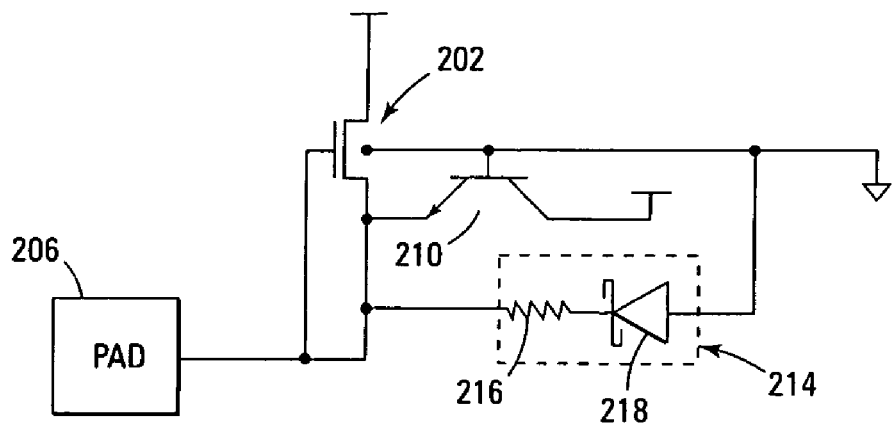
FIG. 3 is a more detailed diagram of a portion of the embodiment of FIG. 2.

FIG. 3 shows a portion of the embodiment of FIG. 2 in greater detail, showing the actual structure of the parasitic bipolar transistor 210 and the placement of the series circuit 214 in relation to the bipolar transistor 210.

Figure 4:
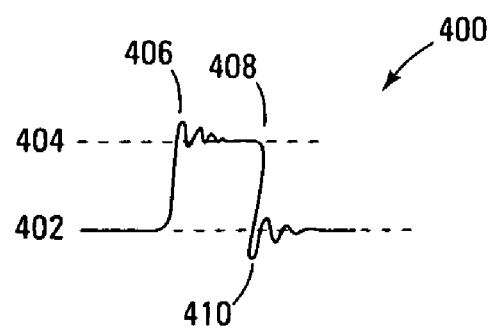
FIG. 4 is a waveform diagram of an undershoot event.

In operation, a waveform for pad voltage exhibits some undershoot or overshoot of voltage during transitions from one data state to another. For example, a typical waveform pattern for application of a voltage is shown in FIG. 4. In FIG. 4, the voltage is moving from a first level 402 to a second level 404 at point 406 and from the second level 404 to the first level 402 at point 408. In an ideal operation, there would be no oscillation of the waveform voltage level upon a switch from a first level to a second level. However, in real operation, overshoots and undershoots occur, and the voltage level oscillates about the desired level until it settles at the desired level, as shown in FIG. 4. At point 408, when the voltage level is dropping from the second level 404 to the first level 402, an undershoot 410 is shown. Such an undershoot, when it appears in a voltage waveform for devices such as the ESD devices discussed herein, can trigger the supply ESD device and interrupt normal operation.

When an undershoot occurs, it is likely to be associated with a known current level, for example 50 milliAmps (mA). Further, the base to emitter turn on voltage ($V_{be}$) for forward biasing of the base to emitter diode of the bipolar transistor is known to be approximately 0.7 volts under nominal conditions. Each ESD device also has an associated snapback voltage $V_{sb}$. When the supply voltage plus the magnitude of any undershoot exceeds the snapback voltage of the device, it can enter snapback. In order to prevent the device from entering snapback, the protection circuit such as protection circuit 214 is utilized.

In one embodiment, source triggered snapback in an ESD protection device is considered. In this embodiment, protection of the ESD device is accomplished by protecting the device from having the base emitter junction of the snapback device forward biased. In this embodiment, the ESD protection device is a snapback device. Such devices have parasitic bipolar devices that occur between the drain and source regions. Each such snapback device can cause potential problems if it enters snapback during normal operation of the IC.

Snapback of MOS or STI devices is well known in the art to ESD engineers. Snapback is a phenomenon that involves the marked reduction in device impedance above a voltage threshold referred to as the snapback voltage of the device. There is also a trigger voltage associated with the snapback mode which is usually greater than the snapback voltage.

The parameters of the resistor and the Schottky diode are configured in various embodiments to prevent substantial forward biasing of the base to emitter diode in the snapback transistor during biased device operation.

For known likely conditions, known typical undershoots will generate a known amount of current through the base emitter junction of the snapback device. For that known current, and for the known characteristics of the bipolar transistor, the embodiments of the protection circuit choose the values of resistance of the resistor and area of the Schottky diode to clamp the voltage drop across the pn diode of the bipolar transistor to less than its turn on voltage. Prevention of the forward bias of the pn diode in the parasitic bipolar device prevents source triggered snapback of the ESD device.

The Schottky diode of certain embodiments of the present invention clamps the pad voltage during undershoot, when ESD devices are not active, to less than the source triggered snapback current of the parasitic bipolar. During an ESD event, however, the current through the Schottky diode can be quite high. The resistor limits the current through the Schottky during a high current ESD event, preventing the Schottky from catastrophic failure. In ESD protection circuits, part operation is under biased conditions, while an ESD event is under unbiased conditions. The source triggered snapback or minority carrier injection events occur when the part is powered up, whereas ESD events occur when the part is not connected to a supply voltage.

For example, a maximum desirable amount of current through the base to emitter junction of the bipolar transistor is determined to not cause source triggered snapback for desired conditions. Given this current, for the series combination of the Schottky diode and resistor in parallel with the pn junction diode of the parasitic bipolar, the resistor and diode are designed or configured with the area of the Schottky diode and the resistance of the resistor adjusted to provide a voltage clamp through the Schottky so as to prevent substantial forward biasing of the base to emitter diode.

Figure 5:
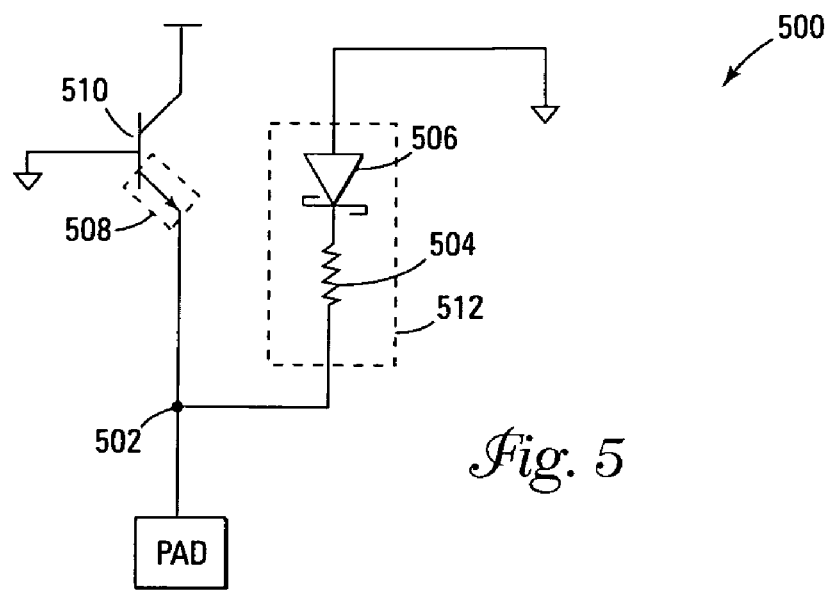
FIG. 5 is a circuit diagram of another embodiment of the present invention.

In the circuit 500 shown in FIG. 5, an undershoot current $I_u$ (for example 50 mA) is flowing through the parallel combination. This configuration substantially prevents forward bias of the base emitter junction of the snapback device for a typical $I_u$, which is typically set by board design. In this circuit, the voltage at node 502 is to be limited, by choosing the resistance value of resistor 504 and the area of Schottky diode 506, to less than the forward turn on voltage of the base to emitter junction 508 of the transistor 510. Depending upon current levels, the diode turn on voltage will differ, so the worst case scenario is assumed in one embodiment, and the current through the base emitter junction is less than the source triggered snapback current under desired conditions. The ESD device is the parasitic snapback device 510 with the base to emitter junction 508. If too much current flows through the base to emitter junction 508, source triggered snapback may occur. Therefore, this embodiment shunts that current through the Schottky diode 506 so as to reduce the risk of source triggered snapback. The alternate current path for the undershoot current $I_u$ is through the Schottky diode 506 and resistor 504.

There is a tradeoff in the resistance value of the resistor 504 and the area of the Schottky diode 506 that must also be considered. As the resistance value increases, the Schottky diode is increasingly protected from excess current of an ESD event. As the area of the Schottky diode is increased, it consumes valuable real estate on the part, but will further reduce the possibility of source triggered snapback.

Figure 5A:
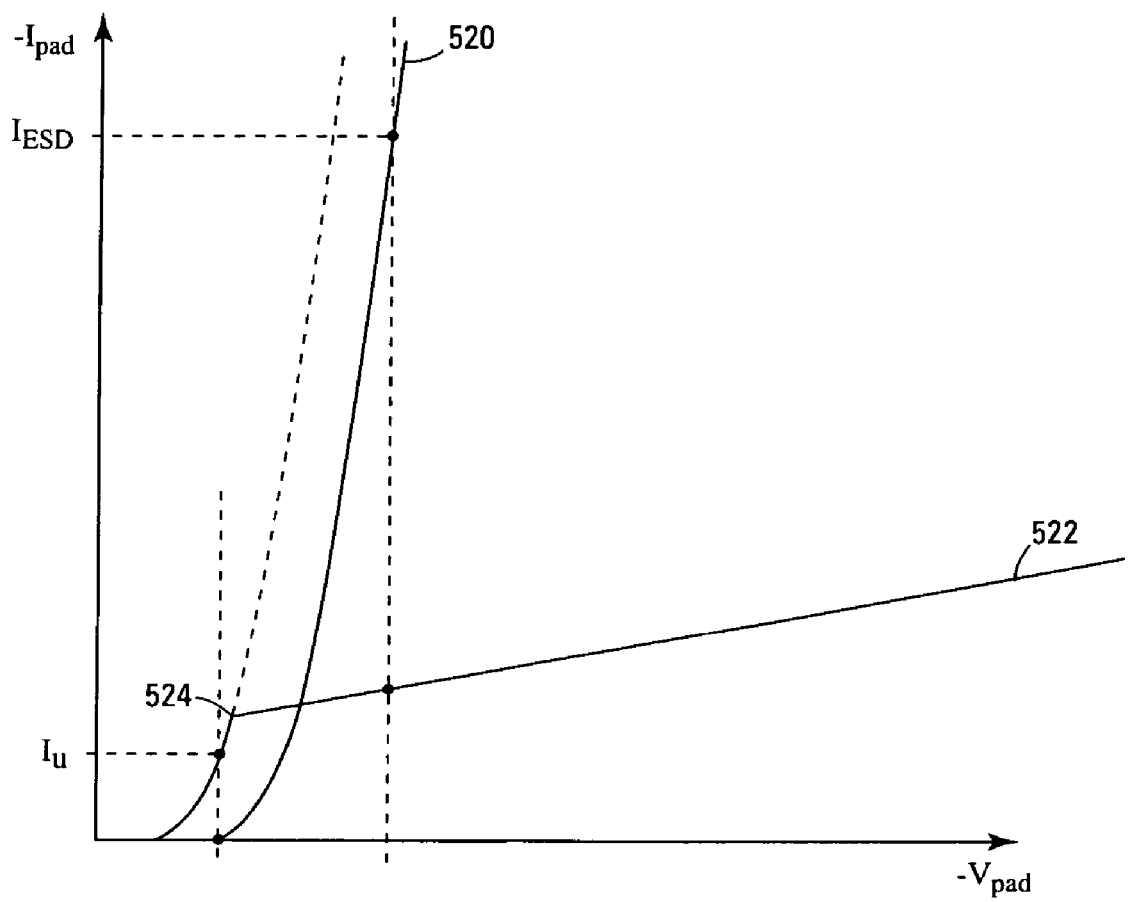
FIG. 5A is a graph of current voltage curves for branches of the circuit of FIG. 5 according to one embodiment of the present invention.

In the circuit 500 of FIG. 5, undershoot current is substantially shunted through the Schottky-resistor combination 512, and the ESD current is substantially shunted through the junction 508. FIG. 5A is a current voltage graph of the two components 508 and 512 of FIG. 5. The components are connected between ground and a pad, and current through the diodes is effected by biasing the pad to a negative voltage. The curves 520 and 522 are forward bias diode curves for the components 508 and 512 respectively. Curve 520 is a pn diode exponential curve. Curve 522 has an earlier turn-on than curve 520, has an inflection point 524 and follows a resistor slope as opposed to a diode slope after the inflection point 524. The dashed extension of curve 522 after the inflection point 524 indicates a configuration in which the value of resistor 504 is zero (0). At the level of the undershoot current $I_u$, substantially all of the current in the system is through the Schottky diode 506. At the level of ESD current IESD, most of the current in the system flows through the pn diode 508.

Figure 6:
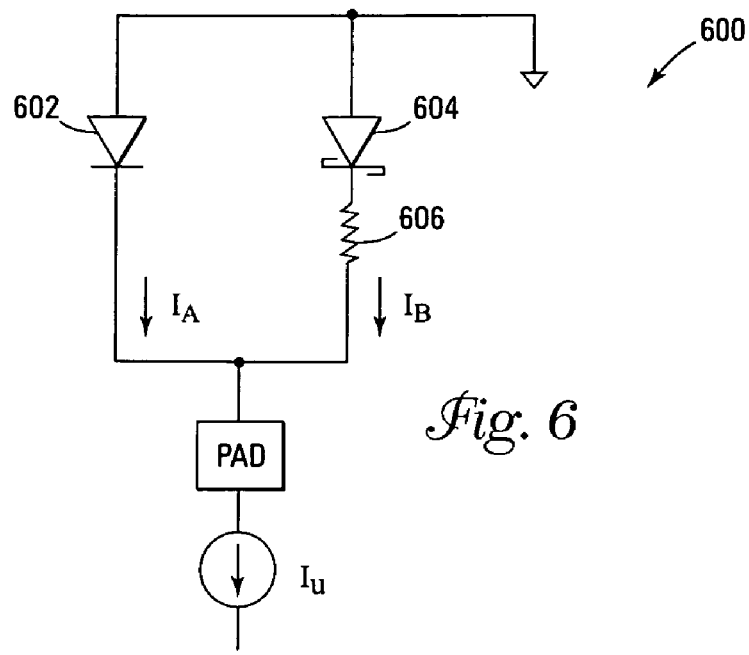
FIG. 6 is a circuit diagram of another embodiment of the present invention.
Figure 6A:
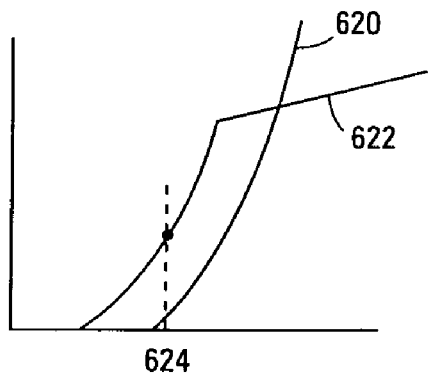
FIGS. 6A, 6B, and 6C are graphs of current voltage curves for choosing Schottky diode area and resistor resistance.
Figure 6B:
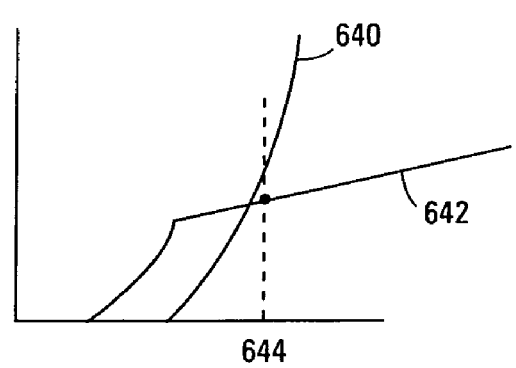
Figure 6C:
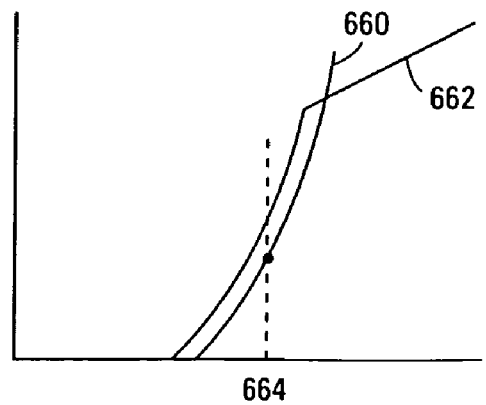

FIG. 6 is a circuit diagram 600 representative of the circuit of FIG. 5, showing current $I_A$ flowing through the pn diode 602 of the snapback transistor and current $I_B$ flowing through the Schottky diode 604 and resistor 606. A total current, the undershoot current $I_u$, flows through the pad 608. In this embodiment, $I_u$ is the sum of $I_A$ and $I_B$. FIGS. 6A, 6B, and 6C show current voltage curves for various configurations of the values A (Schottky diode area) and R (resistor value). FIG. 6A shows graphically a configuration in which $I_A \ll I_B$ at point 624, where $I_A + I_B = I_u$, as shown by the curves 620 for $I_A$ and 622 for $I_B$. FIG. 6B shows graphically curves 640 for $I_A$ and 642 for $I_B$ in a configuration in which R is too large. In this configuration, there is still substantial current through $I_A$, and $I_A > I_B$ at point 644, where $I_A + I_B = I_u$. FIG. 7C shows graphically curves 660 for $I_A$ and 662 for $I_B$ in a configuration in which area A is too small, and therefore $I_A - I_B$ at point 664, where $I_A + I_B = I_u$.

The embodiments of the present invention described above have particular application to a number of situations. Among these, by way of example only and not by way of limitation are protection of electrostatic discharge (ESD) protective circuitry, suppression of minority carrier injection from any n+ diffusion connected to the pad during undershoot events, and oxide voltage clamping for thin oxides. ESD protection is discussed in greater detail above.

ESD Protection

In the occurrence of an ESD event, the Schottky diode is in danger of damage or even destruction, which can cause the IC to no longer meet its operating specification. The resistor decouples the Schottky diode from an ESD event by limiting the current passing through the Schottky diode. Therefore, the ESD protection devices themselves are protected. The current through the ESD protection devices is limited by the resistor, so that the ESD protection devices can effectively clamp the voltage for undershoot current during normal operation of the IC without being subject to excess current themselves during an unbiased ESD event.

Suppression of Minority Carrier Injection for Undershoot Events

Problems due to minority carrier injection from pn junctions are well known to engineers working in the IC field, especially to those engineers working with memory devices such as dynamic random access memory (DRAM) or static random access memory (SRAM). These problems include but are not limited to collection of injected electrons on high impedance circuit nodes, or in the case of DRAM and SRAM, on the memory nodes themselves. In a pn junction with n+ diffusion and p-wells, the majority of junction or diode current during current flow is electrons. The electrons are minority carriers in the p-well and their minority carrier diffusion length is long. The long diffusion length of the electrons can cause the problems referred to above to occur far away from the pn junction in question. In contrast, a Schottky diode is a majority carrier device, so the metal n-well Schottky diode embodiments of the present invention do not have this injection issue.

Since there are no minority carriers in the Schottky device, the embodiments of the present invention employing Schottky diodes do not have the problem of minority carrier current injection. The embodiments of a Schottky diode and resistor when appropriately sized can substantially prevent injection from any n+/p-well junction associated with the pad. The circuit for ESD device to protect the supply device substantially protects any n+ diffusion on the pad as long as it is sized correctly to shunt the current through it rather than through the pn diode.

Oxide Voltage Clamp for Thin Oxides

Gate oxide thicknesses in devices continue to decrease. Maximum oxide voltages are very dependent on oxide thickness. The maximum oxide voltage of devices typically tracks the supply voltage very closely, so current oxide voltage maximums are very close to supply voltages. Similarly, supply voltages also continue to decrease. Supply voltages have dropped considerably from 5 volts to 3.3 volts to 2.5 volts to 1.8 volts to 1.2 volts or less in only the last several years. As supply voltages continue to drop, and as gate oxide thicknesses continue to decrease, the available voltages to work with in devices also decreases. With the turn on voltage of parasitic devices in ESD circuits being approximately 0.7 volts, the turn on voltages of devices are a larger and larger percentage of the supply voltage, and the supply voltages start to approach snapback voltages as well. When supply voltages approach the turn on voltages for devices, the maximum oxide thickness can no longer be set by the supply voltage and the circuitry, but becomes customer dependent. This creates resultant inconsistencies in operation for different customer specifications, and resultant loss in durability and part yield.

The Schottky diode of the various embodiments of the present invention has a lower turn on voltage of approximately 0.35 volts. Clamping the voltage down to approximately the turn on voltage for the Schottky diode provides a larger benefit as the supply voltages continue to drop, because of its lower turn on voltage. The Schottky diode therefore has approximately 350 millivolts of available difference between the 0.7 volt turn on of typical devices.

The resistor and Schottky diode of the various embodiments are formed from existing materials in the fabrication of the ESD devices. For this reason, no further process steps are required for such fabrication. The process steps for formation of resistors and Schottky diodes are well known in the art and will not be described further herein. In one embodiment, the resistor is formed physically away from the supply voltage ESD device to avoid providing trigger current to the ESD device.

Figure 7:
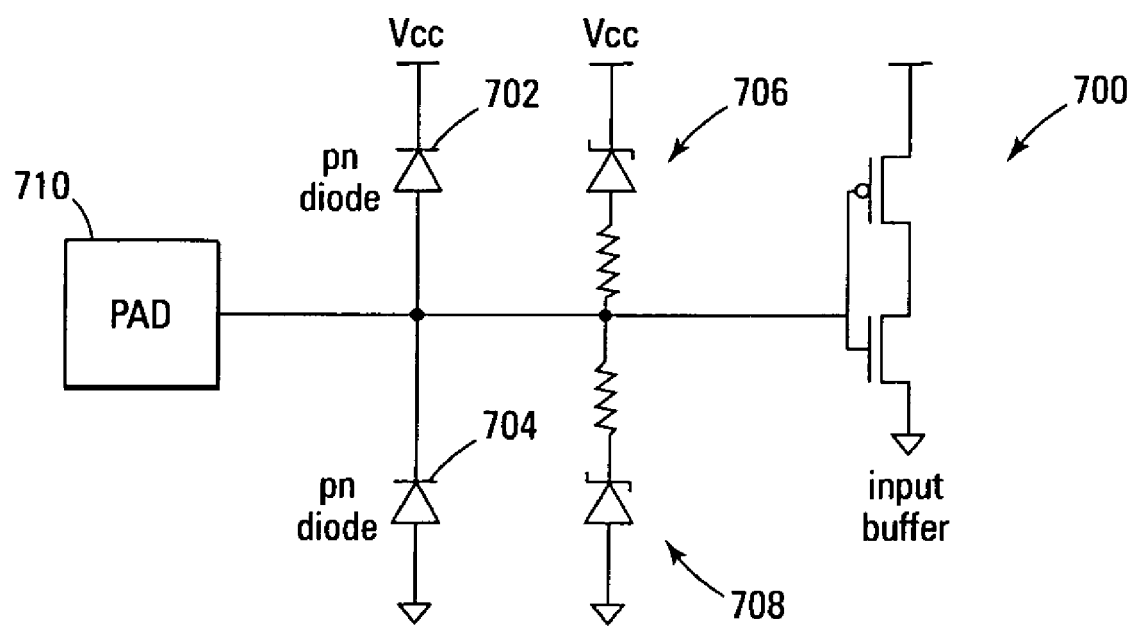
FIG. 7 is a circuit diagram of an oxide clamp according to another embodiment of the present invention.

FIG. 7 is a circuit diagram for an oxide clamp embodiment 700 of the present invention. The pn diode 702 to $V_{cc}$ is in one embodiment a p+/n-well diode that does not have minority carrier injection. The pn diode 704 to ground is in one embodiment an n+/p-well diode that does have minority carrier injection. In this embodiment, two different circuit branches, each comprising a Schottky diode and a resistor in series, are used. One branch 706 clamps between the pad 710 and supply voltage $V_{cc}$. The second branch 708 clamps between the pad 710 and the $V_{ss}$, or ground supply voltage.

In one embodiment, the current is limited with a resistor, and the forward bias voltage is clamped with a Schottky diode. The forward bias clamped in one embodiment is the pad voltage of a pad for an integrated circuit such as a memory device or the like. The resistor and the Schottky diode are connected in series across the pn junction of a parasitic bipolar transistor such as the parasitic bipolar transistor present in a MOS device. The area of the Schottky diode and the resistance of the resistor are configured in one embodiment according to the desired maximum voltage and current to be utilized with the circuit.

The embodiment shown in FIG. 7 is used in other embodiments to clamp an oxide voltage in a thin oxide semiconductor device, to suppress minority carrier injection during undershoot in a snapback device, and the like.

While pn junctions have been discussed with respect to the embodiments of the present invention, it should be understood that that the pn junctions referred to are n+/p-well junctions. There are diodes associated with p+/n-well junctions, but those are not protected by the various embodiments of the present invention. However, as those p+/n-well junctions do not have minority carrier injection into the substrate, protection is not an issue.

Further, all intentional or parasitic pn junctions associated with a pad that are associated with minority carrier injection are protected by the embodiments of the present invention. All n+/p-well devices tied to the pad are covered because the protection is associated with minority carrier injection into the substrate.

All pad associated circuitry is protected by the various embodiments of the present invention, including by way of example only and not by way of limitation input pads, output pads, or input/output (I/O) pads. Devices protected by the embodiments of the present invention are all those with minority carrier injection issues, such as non-transistors, n+ resistors connected to pull-up or pull-down drivers on an output pad, and the like.

Figure 8:
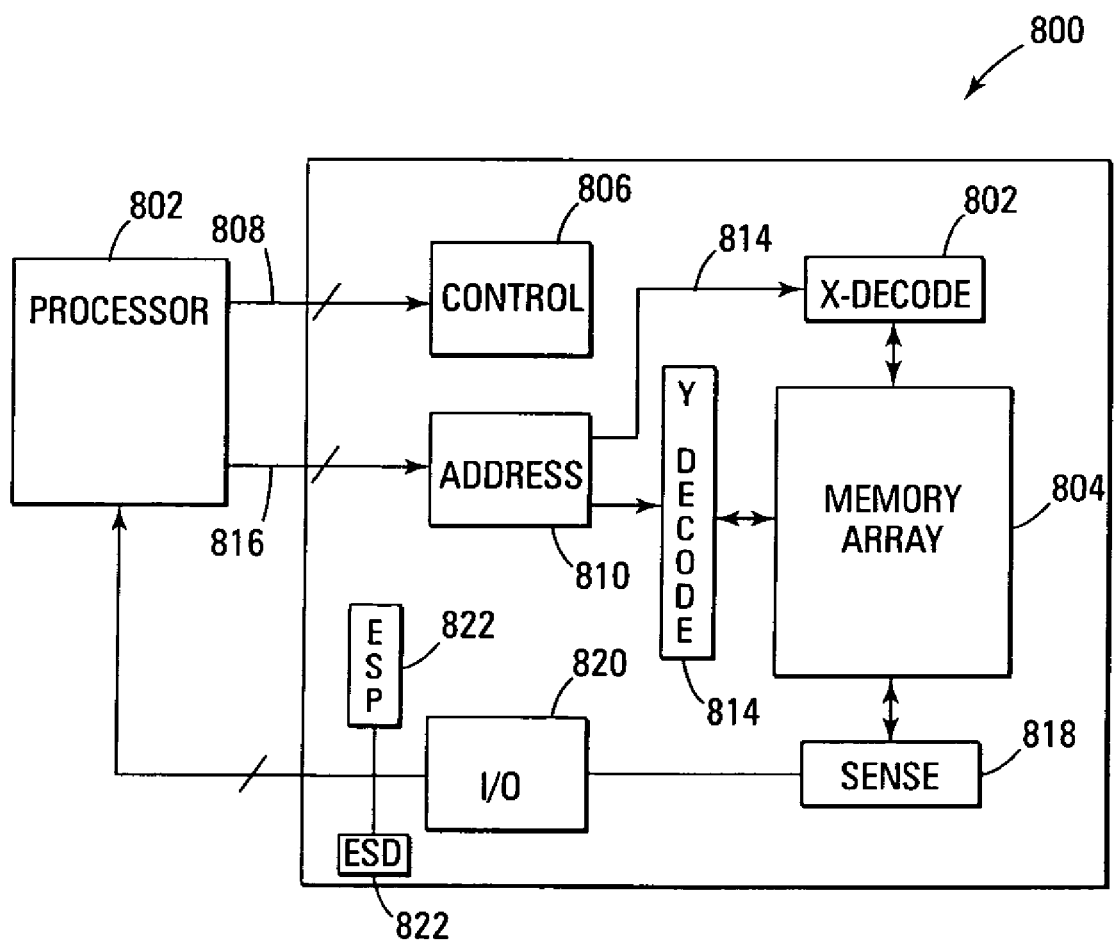
FIG. 8 is a diagram of a processing system according to another embodiment of the present invention.

Referring now to FIG. 8, a simplified block diagram of a memory device 800 of the present invention is described. The memory device can be coupled to a processor 802 for bi-directional data communication. The memory includes an array of memory cells 804. Control circuitry 806 is provided to manage data storage and retrieval from the array in response to control signals 808 from the processor. Address circuitry 810, X-decoder 812 and Y-decoder 814 analyze address signals 816 and access storage locations of the array. Sense circuitry 818 is used to read data from the array and couple output data to I/O circuitry 820. The I/O circuitry operates in a bi-directional manner to receive data from processor 802 and pass this data to array 804. ESD protection devices 822 are positioned in one embodiment before the I/O circuitry to protect the circuitry from ESD events. The ESD protection devices 822 employ ESD protection circuits such as those described above.

In other embodiments, other more basic elements of the memory array 800 which use ESD protection also have ESD protection circuitry such as that described above. For example, an input pad may feed an input buffer, which in turn feeds a number of logic gates to generate logic signals on a die. Eventually, after a number of levels of components, the memory cells themselves are accessed. The ESD protection typically interfaces with only the first several logic layers nearest the pad. The logic leading to the memory cells is what is typically protected by the ESD protection embodiments of the present invention.

In yet another embodiment, an integrated circuit with ESD protection and an ESD protection circuit according to the various embodiments described above is also provided.

CONCLUSION

The various embodiments of the present invention provide an on-chip circuit to prevent source triggered snapback of a supply voltage electrostatic discharge device. The embodiments of the invention substantially prevent source triggered snapback of the supply device during normal IC operation but do not substantially affect triggering of the device during an unbiased ESD event.

The circuit in one embodiment is a series connection of a resistor and a Schottky diode. The resistor limits the current through the Schottky diode during an ESD event to prevent damage to the Schottky device. The Schottky diode clamps the forward bias of a pn junction of the ESD snapback device during an undershoot event to a value less than the source triggered snapback current of the ESD device. The Schottky clamp is to $V_{SS}$ in one embodiment.

Intentional or parasitic pn junctions associated with a pad that are associated with minority carrier injection are protected by the embodiments of the present invention. Further, the embodiments are used to clamp an oxide voltage in a thin oxide semiconductor device.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An electrostatic discharge (ESD) protection device, comprising:
   a snapback device having a parasitic bipolar transistor; and
   a protection circuit for the snapback device wherein the protection circuit comprises:
   a resistor; and
   a Schottky diode connected in series with the resistor; and
   wherein an area of the Schottky diode and a resistance of the resistor are configured to substantially prevent source triggered snapback of the parasitic bipolar transistor.

2. An electrostatic discharge (ESD) protection device, comprising:
   a snapback device having a parasitic bipolar transistor; and a protection circuit for the snapback device wherein the protection circuit comprises:

a resistor; and a Schottky diode connected in series with the resistor;

wherein an area of the Schottky diode and a resistance of the resistor are configured to prevent substantial forward biasing of the parasitic bipolar transistor during biased device operation.

3. A memory device, comprising:

an array of memory cells addressable by address circuitry;

input/output circuitry to receive data from a processor and to pass the data to the array; and an electrostatic discharge (ESD) protection device connected to the input/output circuitry, the ESD device comprising:

an ESD protective transistor; and an ESD protection circuit, wherein the ESD protective transistor has a parasitic bipolar transistor, and wherein the ESD protection circuit is connected in parallel with the base to emitter junction of the parasitic bipolar transistor.

4. The memory device of claim 3, wherein the ESD protection circuit comprises:

a resistor; and a Schottky diode connected in series with the resistor.

5. The memory device of claim 4, wherein the Schottky diode has an area configured to clamp an input pad voltage to less than a source triggered snapback voltage for an ESD parasitic transistor of the ESD device.

6. The memory device of claim 3, wherein the ESD protection circuit is connected across a base to emitter junction of the ESD protective transistor.

7. The memory device of claim 3, wherein the ESD protective circuit is connected between ground and an input pad of the ESD device.

8. The memory device of claim 4, wherein the resistor has a resistance configured to limit current through the Schottky diode during an ESD event.

9. The memory device of claim 4, wherein the Schottky diode has an area configured to clamp a pad voltage to less than a source triggered snapback voltage for a pn diode of the ESD device.

10. The memory device of claim 9, wherein the pad is an input pad.

11. The memory device of claim 9, wherein the pad is an output pad.

12. The memory device of claim 9, wherein the pad is an input/output pad.

13. The memory device of claim 4, wherein a Schottky diode undershoot current is no less than an undershoot current of the base emitter junction for a given voltage.

* * * * *